(12) United States Patent
Lotfi et al.

(10) Patent No.: US 7,688,172 B2
(45) Date of Patent: Mar. 30, 2010

(54) MAGNETIC DEVICE HAVING A CONDUCTIVE CLIP

(75) Inventors: Ashraf W. Lotfi, Bridgewater, NJ (US);
Mathew A. Wilkowski, Nazareth, PA (US); Trifon M. Liakopoulos, Bridgewater, NJ (US); John D. Weld, Ledgewood, NJ (US)

(73) Assignee: Enpirion, Inc., Hampton, NJ (US)

( * ) Notice: Subject to any disclaimer, the term of this patent is extended or adjusted under 35 U.S.C. 154(b) by 0 days.

(21) Appl. No.: 11/244,127

(22) Filed: Oct. 5, 2005

(65) Prior Publication Data

US 2007/0075817 A1    Apr. 5, 2007

(51) Int. Cl.
*H01F 5/00* (2006.01)
(52) U.S. Cl. .................... 336/200; 336/192
(58) Field of Classification Search ............... 336/200
See application file for complete search history.

(56) References Cited

U.S. PATENT DOCUMENTS

| | | | |
|---|---|---|---|
| 1,889,398 A | 11/1932 | Bishop | |
| 2,600,473 A | 6/1952 | Brockman | |
| 3,691,497 A * | 9/1972 | Bailey et al. | 336/192 |
| 3,908,264 A | 9/1975 | Friberg et al. | |
| 4,199,743 A | 4/1980 | Martincic | |
| 4,433,927 A | 2/1984 | Cavallari | |
| 4,586,436 A | 5/1986 | Denney et al. | |
| 4,681,718 A | 7/1987 | Oldham | |
| 4,847,986 A * | 7/1989 | Meinel | 29/606 |
| 4,870,224 A | 9/1989 | Smith et al. | |
| 4,916,522 A | 4/1990 | Cohn | |
| 4,975,671 A * | 12/1990 | Dirks | 336/65 |
| 5,056,214 A | 10/1991 | Holt | |
| 5,118,298 A | 6/1992 | Murphy | |
| 5,187,119 A | 2/1993 | Cech et al. | |
| 5,279,988 A | 1/1994 | Saadat et al. | |
| 5,285,369 A | 2/1994 | Balakrishnan | |
| 5,345,670 A | 9/1994 | Pitzele et al. | |
| 5,353,001 A | 10/1994 | Meinel et al. | |
| 5,428,245 A * | 6/1995 | Lin et al. | 257/666 |
| 5,436,409 A | 7/1995 | Sawada et al. | |
| 5,469,334 A * | 11/1995 | Balakrishnan | 361/782 |

(Continued)

FOREIGN PATENT DOCUMENTS

GB      2 041 818 A     9/1980

(Continued)

OTHER PUBLICATIONS

Betancourt-Zamora, R.J., et al., "A 1.5 mW, 200 MHz CMOS VCO for Wireless Biotelemetry," First International Workshop on Design of Mixed-Mode Integrated Circuits and Applications, Jul. 1997, pp. 72-74, Cancun, Mexico.

(Continued)

*Primary Examiner*—Anh T Mai
*Assistant Examiner*—Joselito Baisa
(74) *Attorney, Agent, or Firm*—Slater & Matsil, L.L.P.

(57) ABSTRACT

A magnetic device that includes a magnetic core having a surface facing a conductive substrate. The magnetic device also includes a conductive clip facing a surface of the magnetic core with ends of the conductive clip electrically coupled to the conductive substrate to cooperatively form a winding therewith about the magnetic core.

20 Claims, 3 Drawing Sheets

U.S. PATENT DOCUMENTS

| | | | |
|---|---|---|---|
| 5,524,334 | A | 6/1996 | Boesel |
| 5,574,420 | A * | 11/1996 | Roy et al. .................. 336/200 |
| 5,578,261 | A | 11/1996 | Manzione et al. |
| 5,692,296 | A | 12/1997 | Variot |
| 5,787,569 | A | 8/1998 | Lotfi et al. |
| 5,802,702 | A | 9/1998 | Fleming et al. |
| 5,920,249 | A | 7/1999 | Huss |
| 5,973,923 | A | 10/1999 | Jitaru |
| 6,005,377 | A | 12/1999 | Chen et al. |
| 6,060,176 | A | 5/2000 | Semkow et al. |
| 6,094,123 | A | 7/2000 | Roy |
| 6,118,351 | A | 9/2000 | Kossives et al. |
| 6,118,360 | A | 9/2000 | Neff |
| 6,160,721 | A | 12/2000 | Kossives et al. |
| 6,255,714 | B1 | 7/2001 | Kossives et al. |
| 6,366,486 | B1 | 4/2002 | Chen et al. |
| 6,440,750 | B1 | 8/2002 | Feygenson et al. |
| 6,466,454 | B1 | 10/2002 | Jitaru |
| 6,479,981 | B2 | 11/2002 | Schweitzer, Jr. et al. |
| 6,495,019 | B1 | 12/2002 | Filas et al. |
| 6,541,819 | B2 | 4/2003 | Lotfi et al. |
| 6,549,409 | B1 | 4/2003 | Saxelby, Jr. et al. |
| 6,578,253 | B1 * | 6/2003 | Herbert ....................... 29/605 |
| 6,624,498 | B2 | 9/2003 | Filas et al. |
| 6,649,422 | B2 | 11/2003 | Kossives et al. |
| 6,731,002 | B2 | 5/2004 | Choi |
| 6,747,538 | B2 | 6/2004 | Kuwata et al. |
| 6,912,781 | B2 | 7/2005 | Morrison et al. |
| 6,989,121 | B2 | 1/2006 | Thummel |
| 6,998,952 | B2 | 2/2006 | Zhou et al. |
| 7,015,544 | B2 | 3/2006 | Lotfi et al. |
| 7,019,505 | B2 | 3/2006 | Dwarakanath et al. |
| 7,020,295 | B2 | 3/2006 | Hamada et al. |
| 7,021,518 | B2 | 4/2006 | Kossives et al. |
| 7,038,438 | B2 | 5/2006 | Dwarakanath et al. |
| 7,057,486 | B2 | 6/2006 | Kiko |
| 7,101,737 | B2 | 9/2006 | Cobbley |
| 7,180,395 | B2 | 2/2007 | Lotfi et al. |
| 7,214,985 | B2 | 5/2007 | Lotfi et al. |
| 7,230,302 | B2 | 6/2007 | Lotfi et al. |
| 7,236,086 | B1 | 6/2007 | Vinciarelli et al. |
| 7,250,842 | B1 | 7/2007 | Johnson et al. |
| 7,256,674 | B2 | 8/2007 | Lotfi et al. |
| 7,276,998 | B2 | 10/2007 | Lotfi et al. |
| 7,330,017 | B2 | 2/2008 | Dwarakanath et al. |
| 7,426,780 | B2 * | 9/2008 | Lotfi et al. ................ 29/602.1 |
| 7,462,317 | B2 | 12/2008 | Lotfi et al. |
| 2001/0030595 | A1 | 10/2001 | Hamatani et al. |
| 2002/0153258 | A1 | 10/2002 | Filas et al. |
| 2003/0076662 | A1 | 4/2003 | Miehling |
| 2005/0167756 | A1 | 8/2005 | Lotfi et al. |
| 2005/0168203 | A1 | 8/2005 | Dwarakanath et al. |
| 2005/0168205 | A1 | 8/2005 | Dwarakanath et al. |
| 2005/0169024 | A1 | 8/2005 | Dwarakanath et al. |
| 2006/0038225 | A1 | 2/2006 | Lotfi et al. |
| 2006/0096087 | A1 | 5/2006 | Lotfi et al. |
| 2006/0096088 | A1 | 5/2006 | Lotfi et al. |
| 2006/0097831 | A1 | 5/2006 | Lotfi et al. |
| 2006/0097832 | A1 | 5/2006 | Lotfi et al. |
| 2006/0097833 | A1 | 5/2006 | Lotfi et al. |
| 2006/0145800 | A1 * | 7/2006 | Dadafshar et al. ............. 336/82 |
| 2007/0074386 | A1 | 4/2007 | Lotfi et al. |
| 2007/0075815 | A1 | 4/2007 | Lotfi et al. |
| 2007/0075816 | A1 | 4/2007 | Lotfi et al. |
| 2008/0301929 | A1 | 12/2008 | Lotfi et al. |
| 2009/0068761 | A1 | 3/2009 | Lotfi et al. |

FOREIGN PATENT DOCUMENTS

| | | |
|---|---|---|
| JP | 2-228013 A | 9/1990 |
| JP | 5-314885 | 11/1993 |
| JP | 6-251958 | 9/1994 |

OTHER PUBLICATIONS

Goodman, J., et al., "An Energy/Security Scalable Encryption Processor Using an Embedded Variable Voltage DC/DC Converter," IEEE Journal of Solid-State Circuits, Nov. 1998, pp. 1799-1809, vol. 33, No. 11, IEEE, Los Alamitos, CA.

Horowitz, P., et al., "The Art of Electronics," Second Edition, 1989, Chapter 5: Active Filters and Oscillators, pp. 288-291, Cambridge University Press, Cambridge, MA.

Lotfi, A.W., et al., "Issues and Advances in High-Frequency Magnetics for Switching Power Supplies," Proceedings of the IEEE, Jun. 2001, pp. 833-845, vol. 89, No. 6, IEEE, Los Alamitos, CA.

Sato, M., et al., "Influences of Molding Conditions on Die-pad Behavior in IC Encapsulation Process Analyzed by Hall Element Method," IEEE Transactions on Advanced Packaging, Aug. 2000, pp. 574-581, vol. 23, No. 3, IEEE, Los Alamitos, CA.

"Technical Specification: PMF 8000 Series: POL Regulator, Input 10.8-13.2 V, Output 10 A/55 W," EN/LZT 146 318 R1C, Sep. 2006, pp. 1-47, Ericsson Power Modules AB, Stockholm, Sweden.

* cited by examiner

MAGNETIC DEVICE HAVING A CONDUCTIVE CLIP

TECHNICAL FIELD

The present invention is directed, in general, to electronic devices and, in particular, to magnetic devices and power modules, and related methods of forming the same.

BACKGROUND

Magnetic devices such as inductors are often used in circuit design for electronic devices (e.g., power modules) in which energy is stored in a magnetic field surrounding an electrically conductive element such as a coil of copper wire. To produce an inductor that can store a useful amount of energy for a given size and a given current level, a number of electrically conductive turns or wires are formed around a magnetic structure or core such as a layer of magnetic material. The magnetic field is enhanced by the permeability of the magnetic material and by the presence of the multiple conductive turns. As the size of electronic devices has been reduced by using integrated circuits and printed wiring boards with surface mount assembly techniques, the size of inductors has not, to date, decreased proportionately.

Attempts to use finer wire sizes have resulted in inductor designs with limited current handling capability. Silver is recognized as a slightly better conductor than copper for higher current levels, but its expense is generally not warranted in practical products. These effects have combined to make the design of magnetic devices a continuing object for further size and cost reductions without compromising the respective current ratings.

A number of approaches beyond the use of finer copper wire have been used in the past to produce smaller inductors. For instance, U.S. Pat. No. 6,094,123 entitled "Low Profile Surface Mount Chip Inductor," to Apurba Roy, issued Jul. 25, 2000 and U.S. Pat. No. 5,802,702 entitled "Method of Making a Device including a Metallized Magnetic Substrate," to Fleming, et al., issued Sep. 8, 1998, which are incorporated herein by reference, disclose magnetic devices that form recesses in a bar of magnetic material for conductors and deposit conductive material in the recesses. Additionally, U.S. Pat. No. 5,574,420 entitled "Low Profile Surface Mounted Magnetic Devices and Components Therefor," to Roy, et al., issued Nov. 12, 1996, which is incorporated by reference, discloses a magnetic device that forms conductive pathways in a body of magnetic material, adds windings by inserting staple-like conductive piece parts through apertures in the body, and solders the staples to a patterned printed wiring board placed below a ceramic magnetic bar to complete the winding structure. Each of the magnetic devices disclosed in the aforementioned references suffer from a current limitation therefor, which is an impractical design and manufacturing approach for a mass market. The aforementioned magnetic devices also provide inadequate heat dissipation capability or reduction in the size thereof.

Thus, the designs for the magnetic devices in the past are inadequate to produce a sufficiently miniaturized magnetic device with a substantial current rating for application in compact devices such as high density power converters embodied in power modules. The power converters often employ magnetic devices that can sustain currents exceeding one ampere and are operable at switching frequencies that exceed one megahertz. Additionally, the magnetic devices should exhibit very low electrical resistance at the switching frequency and should be more compact than presently achievable designs. The design of power converters is inadequately served by these aforementioned limitations of present magnetic devices. In addition, a magnetic device integrable with manufacturing processes of the commensurate end product such as a power module would provide substantial cost savings therefor.

Accordingly, what is needed in the art is a magnetic device, and related method of forming the same, that can meet the more stringent requirements of present applications such as compact, efficient and high density power modules, while being manufacturable at high volume and with lower cost than is achieved with the prior art.

SUMMARY OF THE INVENTION

These and other problems are generally solved or circumvented, and technical advantages are generally achieved, by advantageous embodiments of the present invention which includes a magnetic device having a magnetic core having a surface facing a conductive substrate. The magnetic device also includes a conductive clip facing a surface of the magnetic core with ends of the conductive clip electrically coupled to the conductive substrate to cooperatively form a winding therewith about the magnetic core.

In another aspect, the present invention provides a magnetic device including a magnetic core formed from a bar of magnetic material adhered to a patterned, conductive leadframe. The magnetic device also includes at least one conductive clip placed above the magnetic core with ends of the at least one conductive clip soldered to the conductive leadframe to cooperatively form a winding therewith about the magnetic core.

The foregoing has outlined rather broadly the features and technical advantages of the present invention in order that the detailed description of the invention that follows may be better understood. Additional features and advantages of the invention will be described hereinafter which form the subject of the claims of the invention. It should be appreciated by those skilled in the art that the conception and specific embodiment disclosed may be readily utilized as a basis for modifying or designing other structures or processes for carrying out the same purposes of the present invention. It should also be realized by those skilled in the art that such equivalent constructions do not depart from the spirit and scope of the invention as set forth in the appended claims.

BRIEF DESCRIPTION OF THE DRAWINGS

For a more complete understanding of the present invention, and the advantages thereof, reference is now made to the following descriptions taken in conjunction with the accompanying drawings, in which.

DETAILED DESCRIPTION OF ILLUSTRATIVE EMBODIMENTS

Figure 1:
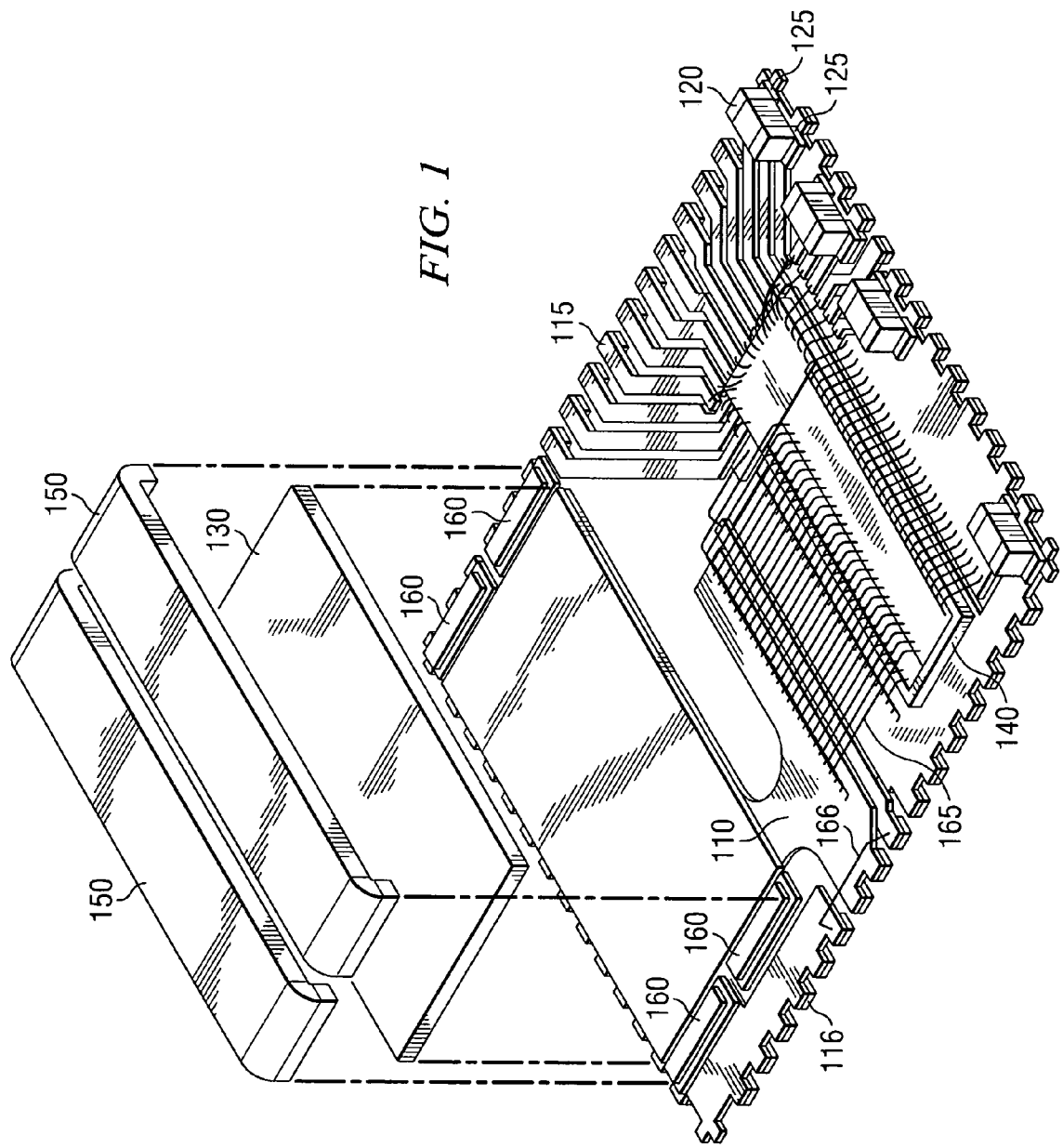
FIGS. 1 and 2 illustrate isometric views of an embodiment of an electronic device, before encapsulation, constructed according to the principles of the present invention.

The making and using of the presently preferred embodiments are discussed in detail below. It should be appreciated, however, that the present invention provides many applicable inventive concepts that can be embodied in a wide variety of specific contexts. The specific embodiments discussed are merely illustrative of specific ways to make and use the invention, and do not limit the scope of the invention.

The present invention will be described with respect to preferred embodiments in a specific context, namely, a magnetic device, an electronic device (e.g., a power module) and a method of manufacture thereof. As the size of magnetic devices continues to shrink, the magnetic devices are also referred to as micromagnetic devices. For the purposes of the present invention, the terms may be used synonymously. While the principles of the present invention will be described in the environment of a power module, any application that may benefit from a magnetic device as described herein is well within the broad scope of the present invention.

As will become more apparent, a magnetic device embodied in an inductor is formed with a magnetic core (e.g., a bar of magnetic material) proximate (e.g., above) a conductive substrate (e.g., an electrically conductive leadframe), and a conductive clip positioned proximate (e.g., above) the magnetic core to complete a winding thereabout (e.g., around). Thus, a surface (e.g., a lower surface) of the magnetic core faces (e.g., generally oriented toward) the conductive substrate and a surface (e.g., an upper surface) of the magnetic core faces (e.g., generally oriented toward) the conductive clip. As described herein, the magnetic core is formed of a medium that generally conducts a given magnetic flux level for a lower level of applied magneto-motive force, such as measured in ampere-turns, compared to a non-magnetic medium such as air (or a vacuum). The magnetic core may occupy a closed flux path such as provided by a torroidal structure, or may occupy a portion of a flux path such as provided by a flat or round bar of magnetic material. The magnetic core includes structures such as bars and rods, as well as films, and may include multiple layers including intervening layers and layers that improve the magnetic properties thereof.

In addition to the magnetic device, an electronic device such as a power module includes other integrated circuits (either in bare die or module form) and surface-mount components coupled (e.g., adhesively mounted) to the conductive substrate and electrically coupled thereto with wire bonds. An encapsulant such as plastic molded material is placed around the magnetic device, integrated circuit and/or the surface-mount components. The power module may also include a power conversion circuitry that includes or may be embodied in the magnetic device, the integrated circuit, and at least one surface-mount component. It should be understood that the power module may form, at least in part, a power management system, which itself is often referred to as a power management integrated circuit.

Figure 2:
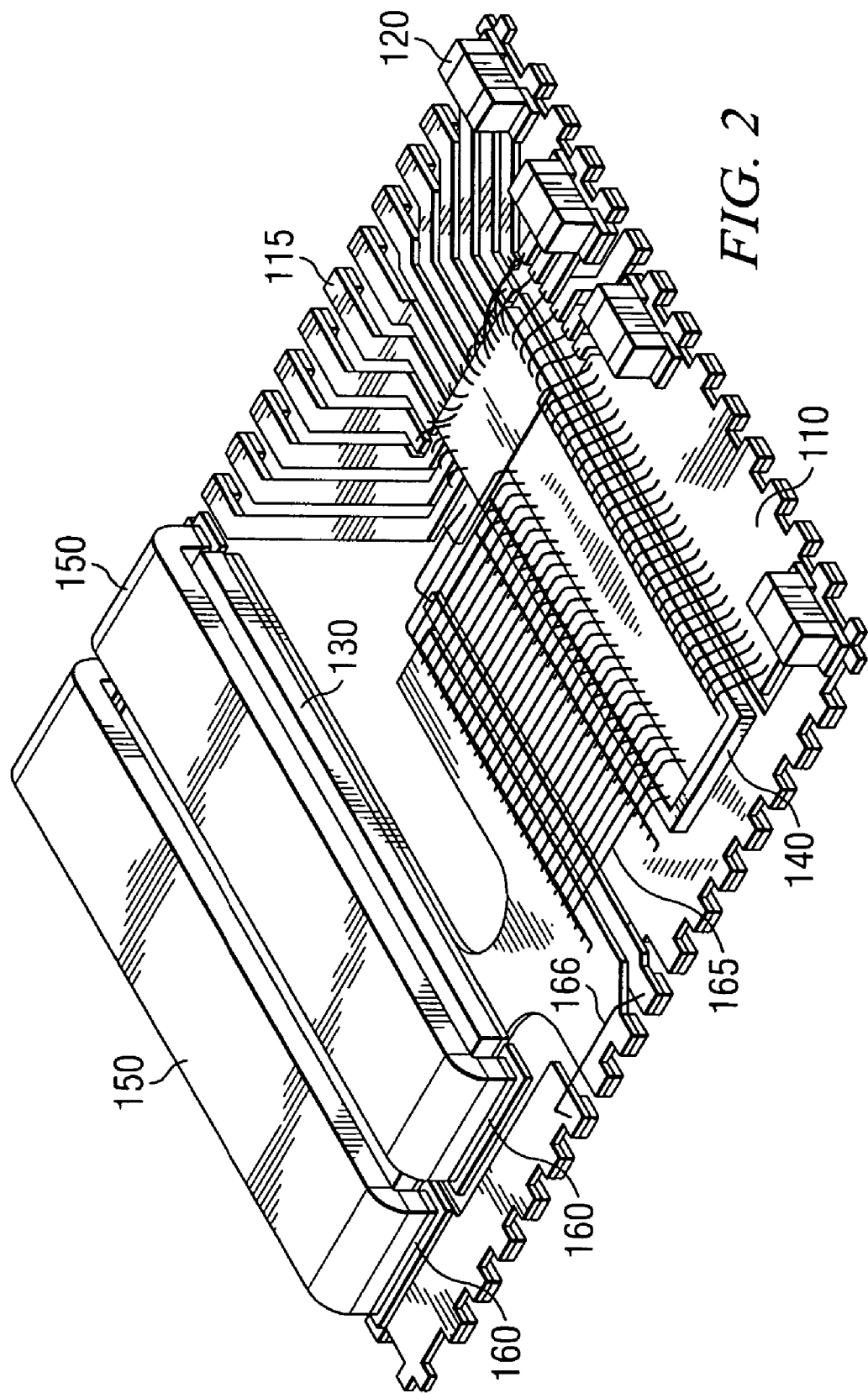

Referring initially to FIGS. 1 and 2, illustrated are isometric views of an embodiment of an electronic device (e.g., power module), before encapsulation, constructed according to the principles of the present invention. The power module includes a magnetic device (e.g., inductor), an integrated circuit and surface-mount components. The power module may include power conversion circuitry that includes or may be embodied in the magnetic device, the integrated circuit and at least one of the surface-mount components. The power conversion circuitry may form a power converter that often includes switching regulators such as buck switching regulators with digital control circuits for reduced component count, and synchronous rectifiers for high power conversion efficiency. Of course, the broad scope of the present invention is not limited to a power module, power converter or the like, and may be applicable to other electronic devices.

A conductive substrate (e.g., conductive leadframe or leadframe) 110 is patterned and etched to form an electrically conductive interconnect layer for the lower portion of a winding for the inductor as well as the electrical interconnections among surface-mount components, the integrated circuit, and the inductor. A typical thickness of the leadframe 110 is about eight mils. While the leadframe 110 is often constructed of copper, alternative electrically conductive materials can be used therefor. The leadframe 110 provides external connections for the power module, as well as a support base for a magnetic material for the inductor. The external connections are formed as fingers of the leadframe 110, referenced as leadframe fingers (two of which are designated 115, 116).

The leadframe 110 is generally constructed with an integral strip surrounding the electrically conductive pattern to provide mechanical support during the manufacturing steps, which strip is discarded later in the manufacturing process. The surrounding strip is generally sheared off after the electronic device has been constructed. The leadframe 110 is generally produced in an array of repeating of patterns (not shown), such as a 16×16 array, to form, for example, 256 substantially identical electronic devices. Forming an array of leadframes 110 is a process well known in the art to reduce the manufacturing cost of producing the electronic devices.

Solder paste is selectively applied to the leadframe 110 in a thin layer to areas (one of which is designated 125) for screening processes, to provide electrical and mechanical attachment for surface-mount components. The surface-mount components such as capacitors (one of which is designated 120) are placed with their conductive ends in the solder paste. The solder paste may be composed of lead-based as well as lead-free compositions. The array of leadframes 110 with the surface-mount components 120 is reflowed in an oven to mechanically and electrically attach the surface-mount components 120 to the leadframe 110.

The steps as described above generally do not require execution in the highly controlled environment of a clean room. The following steps, however, are preferably performed in a clean room environment such as typically used for assembly of integrated circuits into a molded plastic package, as is generally well known in the art.

An adhesive (e.g., a die attach adhesive such as Abletherm 2600AT by Ablestik of Rancho Dominquez, Calif.) is dispensed onto the leadframe 110 to hold a magnetic core (e.g., a bar of magnetic material) 130 and an integrated circuit in the form of a semiconductor die 140. The bar of magnetic material 130 and the semiconductor die 140 are positioned on the leadframe 110 over the die attach adhesive. Thus, a lower surface of the bar of magnetic material 130 faces, and is preferably adhered to, the leadframe 110. The bar of magnetic material 130 is included to enhance the magnetic properties of the inductor and may be about 250 micrometers (μm) thick, four mils wide and 7.5 mils long. The adhesive is cured, typically in a controlled thermal process, to secure the bar of magnetic material 130 and the semiconductor die 140 to the leadframe 110.

Solder paste is applied to areas (generally designated 160) of the leadframe 110 wherein ends of conductive clips 150 are placed. Again, the solder paste may be composed of lead-based as well as lead-free compositions. The conductive clips 150 (e.g., about 8-12 mils thick) are placed on the leadframe 110 above the bars of magnetic material 130 with their ends in the solder paste. The conductive clips 150 are formed with their ends bent toward the leadframe 110 about ends of the bar of magnetic material 130 without mechanical interference.

Thus, an upper surface of the bar of magnetic material 130 faces the conductive clips 150. An insulating gap, for example, about a five mil air gap, is thus preferably left between the upper surfaces of the bars of magnetic material 130 and the lower surfaces of the conductive clips 150, which gap may be filled later by an encapsulant. The conductive clips 150 provide the portion of the electrically conductive inductor winding above each bar of magnetic material 130. The leadframe 110 is heated in a reflow oven to mechanically and electrically bond the conductive clips 150 to the leadframe 110.

Wire bonds preferably formed of gold wire such as a first wire bond 165 are attached to each semiconductor die 140 and to the leadframe 110 to electrically couple pads on the semiconductor die 140 to bonding areas of the leadframe 110 thereby providing electrical circuit connections therebetween. Wire bonds such as a second wire bond 166 may also be used to selectively electrically couple portions of the leadframe 110 to provide circuit interconnections that cannot be easily wired in a single planar layout, thus producing the topological layout equivalent for the leadframe 110 of a two-layer printed wiring board or substrate.

When the electronic devices are formed in an array as mentioned above, the array is placed in a mold, and an encapsulant such as a molding material, preferably epoxy, is deposited (e.g., injected) thereover as is well known in the art to provide environmental and mechanical protection as well as a thermally conductive covering to facilitate heat dissipation during operation. Other molding materials and processes as well as electronic devices constructed without an encapsulant are well within the broad scope of the present invention.

Figure 3:
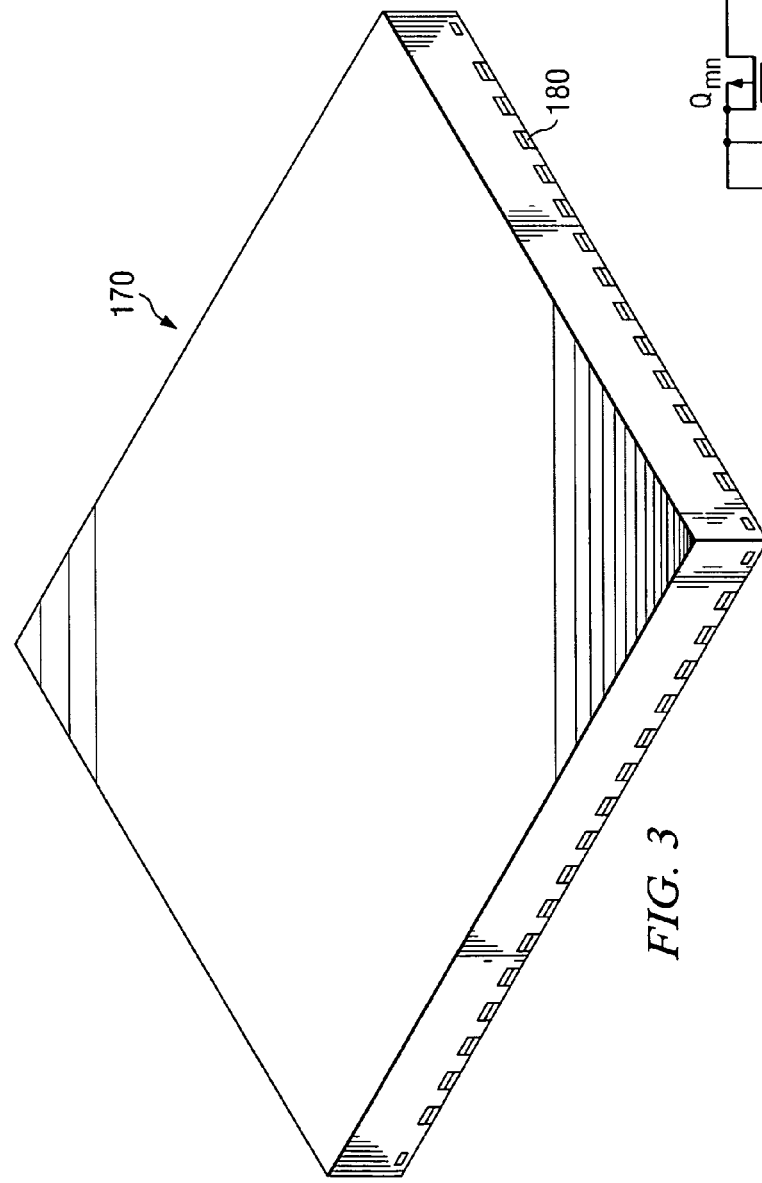
FIG. 3 illustrates an isometric view of an embodiment of an electronic device, after encapsulation, constructed according to the principles of the present invention.

The individual electronic devices are singulated from the array thereof by a punching and shearing operation to produce an encapsulated power module including power conversion circuitry as illustrated with respect to FIG. 3. The power module is mechanically and hermetically protected by the encapsulant 170 as illustrated. External electrical connections to a system employing the power module are made via terminals 180 which are created from exposed leadframe fingers (see FIG. 1) protruding from sides and a lower surface of the power module after encapsulation. Typically, the terminals 180 are substantially coplanar with the sides and lower surface of the power module. The terminals 180 are formed by the shearing and molding operation on the leadframe 110 as is well known in the art.

Electrical connections to the system employing the power module are made by placing the power module on another circuit board or printed wiring board formed with interconnect pads that are covered with solder paste, generally by a screening operation, and heating the power module on the circuit board in a reflow oven. The reflow soldering operation is generally also adequate to provide mechanical attachment of the power module to another printed wiring board, but other attachment methods such as adhesive compound are well within the broad scope of the present invention.

Figure 4:
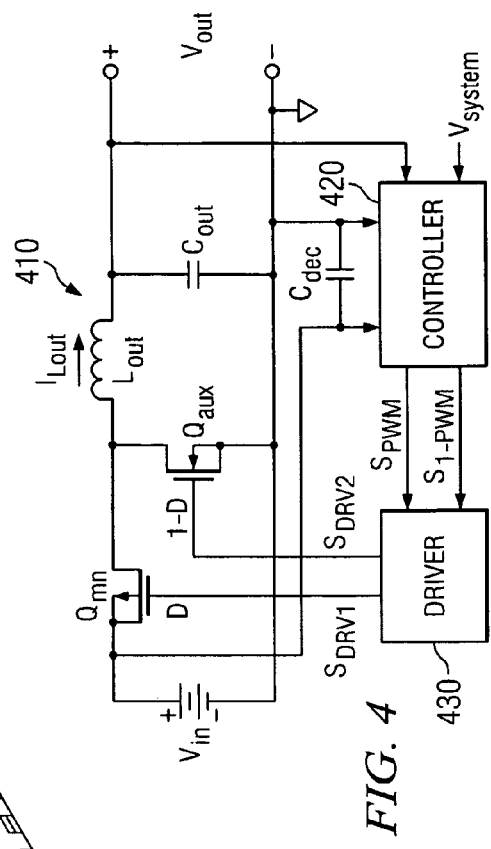
FIG. 4 illustrates a diagram of an embodiment of a power converter including power conversion circuitry constructed according to the principles of the present invention.

Turning now to FIG. 4, illustrated is a diagram of an embodiment of a power converter including power conversion circuitry constructed according to the principles of the present invention. The power converter includes a power train 410, a controller 420 and a driver 430, and provides power to a system such as a microprocessor. While in the illustrated embodiment, the power train 410 employs a buck converter topology, those skilled in the art should understand that other converter topologies such as a forward converter topology are well within the broad scope of the present invention.

The power train 410 receives an input voltage $V_{in}$ from a source of electrical power (represented by a battery) at an input thereof and provides a regulated output voltage $V_{out}$ to power, for instance, a microprocessor at an output thereof. In keeping with the principles of a buck converter topology, the output voltage $V_{out}$ is generally less than the input voltage $V_{in}$ such that a switching operation of the power converter can regulate the output voltage $V_{out}$. A switch (e.g., a main switch $Q_{mn}$) is enabled to conduct for a primary interval (generally co-existent with a primary duty cycle "D" of the main switch $Q_{mn}$) and couples the input voltage $V_{in}$ to an output filter inductor $L_{out}$. During the primary interval, an inductor current $I_{Lout}$ flowing through the output filter inductor $L_{out}$ increases as a current flows from the input to the output of the power train 410. A component of the inductor current $I_{Lout}$ is filtered by the output capacitor $C_{out}$.

During a complementary interval (generally co-existent with a complementary duty cycle "1-D" of the main switch $Q_{mn}$), the main switch $Q_{mn}$ is transitioned to a non-conducting state and another switch (e.g., an auxiliary switch $Q_{aux}$) is enabled to conduct. The auxiliary switch $Q_{aux}$ provides a path to maintain a continuity of the inductor current $I_{Lout}$ flowing through the output filter inductor $L_{out}$. During the complementary interval, the inductor current $I_{Lout}$ through the output filter inductor $L_{out}$ decreases. In general, the duty cycle of the main and auxiliary switches $Q_{mn}$, $Q_{aux}$ may be adjusted to maintain a regulation of the output voltage $V_{out}$ of the power converter. Those skilled in the art should understand, however, that the conduction periods for the main and auxiliary switches $Q_{mn}$, $Q_{aux}$ may be separated by a small time interval to avoid cross conduction therebetween and beneficially to reduce the switching losses associated with the power converter.

The controller 420 receives a desired characteristic such as a desired system voltage $V_{system}$ from an internal or external source associated with the microprocessor, and the output voltage $V_{out}$ of the power converter. The controller 420 is also coupled to the input voltage $V_{in}$ of the power converter and a return lead of the source of electrical power (again, represented by a battery) to provide a ground connection therefor. A decoupling capacitor $C_{dec}$ is coupled to the path from the input voltage $V_{in}$ to the controller 420. The decoupling capacitor $C_{dec}$ is configured to absorb high frequency noise signals associated with the source of electrical power to protect the controller 420.

In accordance with the aforementioned characteristics, the controller 420 provides a signal (e.g., a pulse width modulated signal $S_{PWM}$) to control a duty cycle and a frequency of the main and auxiliary switches $Q_{mn}$, $Q_{aux}$ of the power train 410 to regulate the output voltage $V_{out}$ thereof. The controller 420 may also provide a complement of the signal (e.g., a complementary pulse width modulated signal $S_{1-PWM}$) in accordance with the aforementioned characteristics. Any controller adapted to control at least one switch of the power converter is well within the broad scope of the present invention. As an example, a controller employing digital circuitry is disclosed in U.S. Patent Application Publication No. 2005/0169024, entitled "Controller for a Power Converter and a Method of Controlling a Switch Thereof," to Dwarakanath, et al. and U.S. Patent Application Publication No. 2005/0168205, entitled "Controller for a Power Converter and Method of Controlling a Switch Thereof," to Dwarakanath, et al., which are incorporated herein by reference.

The power converter also includes the driver 430 configured to provide drive signals $S_{DRV1}$, $S_{DRV2}$ to the main and auxiliary switches $Q_{mn}$, $Q_{aux}$ respectively, based on the signals $S_{PWM}$, $S_{1-PWM}$ provided by the controller 420. There are a number of viable alternatives to implement a driver 430 that include techniques to provide sufficient signal delays to prevent crosscurrents when controlling multiple switches in the power converter. The driver 430 typically includes switching circuitry incorporating a plurality of driver switches that cooperate to provide the drive signals $S_{DRV1}$, $S_{DRV2}$ to the main and auxiliary switches $Q_{mn}$, $Q_{aux}$. Of course, any driver 430 capable of providing the drive signals $S_{DRV1}$, $S_{DRV2}$ to control a switch is well within the broad scope of the present invention. As an example, a driver is disclosed in U.S. Patent Application Publication No. 2005/0168203, entitled "Driver for a Power Converter and Method of Driving a Switch Thereof," to Dwarakanath, et al., which is incorporated herein by reference. Also, an embodiment of a semiconductor device that may embody portions of the power conversion circuitry is disclosed in U.S. Patent Application Publication No. 2005/0167756, entitled "Laterally Diffused Metal Oxide Semiconductor Device and Method of Forming the Same," to Lotfi, et al., which is incorporated herein by reference, and an embodiment of an integrated circuit embodying power conversion circuitry, or portions thereof, is disclosed in U.S. Patent Application Publication No. 2006/0038225, entitled "Integrated Circuit Employable with a Power Converter," to Lotfi, et al., which is incorporated by reference.

Thus, a magnetic device, a power module and a method of manufacture thereof with readily attainable and quantifiable advantages have been introduced. Those skilled in the art should understand that the previously described embodiments of the magnetic device and power module are submitted for illustrative purposes only. In addition, other embodiments capable of producing a magnetic device and a power module while addressing compact, efficient and high density power modules, while being manufacturable at high volume and with lower cost than is achieved with the prior art are well within the broad scope of the present invention. While the magnetic device has been described in the environment of a power converter, the magnetic device may also be incorporated into other electronic devices, systems or assemblies such as communication or computing devices or other power processing devices.

As mentioned above, the present invention provides a magnetic device including a magnetic core having a surface facing a conductive substrate and a conductive clip facing a surface of the magnetic core with ends of the conductive clip electrically coupled to the conductive substrate to cooperatively form a winding therewith about the magnetic core. As an example, the present invention provides an inductor compatible with ordinary manufacturing and packaging processes for power management integrated circuits. The inductor includes a magnetic core formed from a bar of magnetic material adhered to conductive substrate (e.g., a patterned, conductive leadframe) and at least one conductive clip is placed above the bar of magnetic material to complete the portion of the inductor winding above the leadframe. Preferably, the conductive clip is made of copper, but other electrically conductive materials are well within the broad scope of the present invention. The bar of magnetic material is adhered to the leadframe with a die attach adhesive, and the at least one conductive clip is soldered to the leadframe. The inductor is preferably encapsulated with plastic encapsulating compound including an epoxy.

In an exemplary embodiment, the bar of magnetic material includes a ceramic material such as a soft magnetic ferrite having manganese zinc or nickel zinc ferrite. In a further exemplary embodiment, the bar of magnetic material is formed with a metallic alloy such as an iron cobalt alloy deposited via an electroplating process on a semiconductor or insulating die such as a silicon die. The at least one conductive clip may be soldered to the leadframe in a reflow soldering process. Additionally, a gap may be formed between the at least one conductive clip and the bar of magnetic material. In accordance therewith, the gap is typically filled with plastic encapsulating compound. The integrated circuit is also adhered to the leadframe. Preferably, the integrated circuit is wire bonded (via, for instance, gold wires) to the leadframe to form electrical connections therebetween. Surface-mount components may also be soldered to the leadframe.

In accordance with another aspect of the present invention, a magnetic device, integrated circuit and surface-mount components are integrated to form an electronic device such as a power module or power management integrated circuit. In other aspects, the present invention provides methods of forming the magnetic device and power module that take advantage of current practices in the field of power management integrated circuits.

For a better understanding of power converters, see "Modern DC-to-DC Switchmode Power Converter Circuits," by Rudolph P. Severns and Gordon Bloom, Van Nostrand Reinhold Company, New York, N.Y. (1985) and "Principles of Power Electronics," by J. G. Kassakian, M. F. Schlecht and G. C. Verghese, Addison-Wesley (1991). For a better understanding of magnetic devices, see "Soft Ferrites: Properties and Applications," by E. C. Snelling, published by Butterworth-Heinemann, Second Edition, 1989. The aforementioned references are incorporated herein by reference in their entirety.

Also, although the present invention and its advantages have been described in detail, it should be understood that various changes, substitutions and alterations can be made herein without departing from the spirit and scope of the invention as defined by the appended claims. For example, many of the processes discussed above can be implemented in different methodologies and replaced by other processes, or a combination thereof.

Moreover, the scope of the present application is not intended to be limited to the particular embodiments of the process, machine, manufacture, composition of matter, means, methods and steps described in the specification. As one of ordinary skill in the art will readily appreciate from the disclosure of the present invention, processes, machines, manufacture, compositions of matter, means, methods, or steps, presently existing or later to be developed, that perform substantially the same function or achieve substantially the same result as the corresponding embodiments described herein may be utilized according to the present invention. Accordingly, the appended claims are intended to include within their scope such processes, machines, manufacture, compositions of matter, means, methods, or steps.

What is claimed is:

1. A magnetic device, comprising:
   a magnetic core having a lower surface adhered to an adhesive on a patterned, conductive leadframe and a planar opposing upper surface; and
   a conductive clip with a bare lower surface facing said opposing upper surface of said magnetic core and with ends of said conductive clip bent toward said conductive leadframe about ends of said magnetic core and electrically coupled to said conductive leadframe to cooperatively form a winding therewith about said magnetic core, wherein said conductive leadframe also forms an electrically conductive interconnect layer for a component wire bonded thereto.

2. The magnetic device as recited in claim 1 wherein said conductive clip is about 8 to 12 mils in thickness.

3. The magnetic device as recited in claim 1 wherein said component is a semiconductor die.

4. The magnetic device as recited in claim 1 wherein said magnetic core is formed from manganese zinc ferrite.

5. The magnetic device as recited in claim 1 wherein said conductive leadframe includes leadframe fingers that form terminals for external electrical connections.

6. The magnetic device as recited in claim 1 wherein said adhesive is a die attach adhesive.

7. The magnetic device as recited in claim 1 wherein said magnetic device is an inductor.

8. The magnetic device as recited in claim 1 wherein said conductive clip is soldered to said conductive leadframe.

9. The magnetic device as recited in claim 1 further comprising a gap between said lower surface of said conductive clip and said opposing upper surface of said magnetic core.

10. The magnetic device as recited in claim 1 further comprising an encapsulant about said magnetic device.

11. A magnetic device, comprising:
- a magnetic core formed from a bar of magnetic material having a lower surface adhered to an adhesive on a patterned, conductive leadframe and a planar opposing upper surface; and
- at least one conductive clip with a bare lower surface placed above said opposing upper surface of said magnetic core and with ends of said at least one conductive clip bent toward and soldered to said conductive leadframe about ends of said magnetic core to cooperatively form a winding therewith about said magnetic core, wherein said conductive leadframe also forms an electrically conductive interconnect layer for a component wire bonded thereto.

12. The magnetic device as recited in claim 11 wherein said bar of magnetic material is formed from manganese zinc ferrite.

13. The magnetic device as recited in claim 11 wherein said conductive leadframe includes leadframe fingers that form terminals for external electrical connections.

14. The magnetic device as recited in claim 11 wherein said component is a semiconductor die.

15. The magnetic device as recited in claim 11 wherein said adhesive is a die attach adhesive.

16. The magnetic device as recited in claim 11 further comprising a gap between said lower surface of said at least one conductive clip and said opposing surface of said magnetic core.

17. The magnetic device as recited in claim 11 further comprising a gap substantially filled with an encapsulant between said lower surface of said at least one conductive clip and said opposing surface of said magnetic core.

18. The magnetic device as recited in claim 11 further comprising an encapsulant about said magnetic device.

19. The magnetic device as recited in claim 11 further comprising an epoxy encapsulant about said magnetic device.

20. The magnetic device as recited in claim 11 wherein said magnetic device is an inductor.

\* \* \* \* \*